United States Patent
Hong

(10) Patent No.: US 10,141,298 B2
(45) Date of Patent: Nov. 27, 2018

(54) SEMICONDUCTOR INTEGRATED CIRCUIT DEVICE RELATING TO AN ELECTRICAL OVER STRESS PROTECTING CIRCUIT

(71) Applicant: SK hynix Inc., Icheon-si, Gyeonggi-do (KR)

(72) Inventor: Yun Seok Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/363,627

(22) Filed: Nov. 29, 2016

(65) Prior Publication Data

US 2018/0026026 A1 Jan. 25, 2018

(30) Foreign Application Priority Data

Jul. 19, 2016 (KR) ........................ 10-2016-0091112

(51) Int. Cl.
| | |
|---|---|
| H01L 29/06 | (2006.01) |
| H01L 27/02 | (2006.01) |
| H01L 23/528 | (2006.01) |
| H01L 45/00 | (2006.01) |
| H02H 9/04 | (2006.01) |

(52) U.S. Cl.
CPC ........ H01L 27/0255 (2013.01); H01L 23/528 (2013.01); H01L 27/0266 (2013.01); H01L 27/0288 (2013.01); H01L 45/06 (2013.01); H01L 45/1233 (2013.01); H01L 45/141 (2013.01); H02H 9/046 (2013.01)

(58) Field of Classification Search
CPC ............ H01L 27/0255; H01L 27/0266; H01L 27/0288; H01L 45/06; H01L 45/141
USPC ............................................ 257/4, 372, 546
See application file for complete search history.

(56) References Cited

U.S. PATENT DOCUMENTS

| | | | |
|---|---|---|---|
| 5,838,146 A | 11/1998 | Singer | |
| 2005/0135174 A1 | 6/2005 | Lee et al. | |
| 2008/0080109 A1* | 4/2008 | Duch | H02H 9/046 361/56 |
| 2009/0244796 A1* | 10/2009 | Tang | H01L 27/0251 361/56 |
| 2011/0210418 A1* | 9/2011 | Esmark | H01L 23/60 257/517 |
| 2016/0013178 A1* | 1/2016 | Song | H01L 27/0266 257/409 |

* cited by examiner

*Primary Examiner* — Matthew E Warren
(74) *Attorney, Agent, or Firm* — William Park & Associates Ltd.

(57) ABSTRACT

A semiconductor integrated circuit device may include a first discharging unit and a second discharging unit. The first discharging unit may be coupled between a first line having a first voltage level and a second line having a second voltage level different from the first voltage level. The first discharging unit may be configured to discharge an electrical over stress (EOS) generated from the first line. The second discharging unit may be coupled between the first line and the second line. The second discharging unit may discharge the EOS in the first line to the second line based on an output signal from the first discharging unit.

10 Claims, 5 Drawing Sheets

SEMICONDUCTOR INTEGRATED CIRCUIT DEVICE RELATING TO AN ELECTRICAL OVER STRESS PROTECTING CIRCUIT

CROSS-REFERENCES TO RELATED APPLICATION

The present application claims priority under 35 U.S.C. § 119(a) to Korean application number 10-2016-0091112, filed on Jul. 19, 2016, in the Korean Intellectual Property Office, which is incorporated herein by reference in its entirety.

BACKGROUND

1. Technical Field

Various embodiments may generally relate to a semiconductor integrated circuit device, and more particularly, to a semiconductor integrated circuit device relating to an electrical over stress (EOS) protecting circuit.

2. Related Art

An electrical over stress (EOS) may electrically impact a device through an abnormal over current or through an abnormal over voltage. The abnormal over current or the abnormal over voltage is caused by a leakage current and a leakage voltage of a device using power. The EOS may be generated within several nano-seconds to several mili-seconds. When the EOS is generated in a semiconductor integrated circuit device, a gate insulating layer of a transistor in the semiconductor integrated circuit device may be broken. Thus, the semiconductor integrated circuit device may include an EOS protecting circuit for protecting internal circuits from the EOS.

SUMMARY

According to an embodiment, there may be provided a semiconductor integrated circuit device. The semiconductor integrated circuit device may include a first discharging unit and a second discharging unit. The first discharging unit may be coupled between a first line having a first voltage level and a second line having a second voltage level different from the first voltage level. The first discharging unit may be configured to discharge an electrical over stress (EOS) generated from the first line. The second discharging unit may be coupled between the first line and the second line. The second discharging unit may discharge the EOS in the first line to the second line based on an output signal from the first discharging unit.

DETAILED DESCRIPTION

Figure 1:
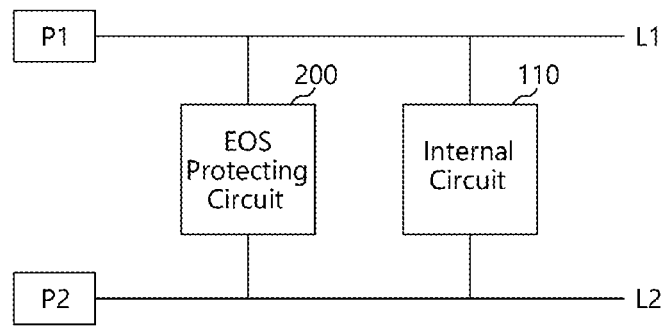
FIG. 1 is a block diagram illustrating a representation of a semiconductor integrated circuit device in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a block diagram illustrating a representation of a semiconductor integrated circuit device in accordance with examples of embodiments.

Referring to FIG. 1, a semiconductor integrated circuit device 100 may include a first pad P1 and a second pad P2. The first pad P1 may be configured to receive a power voltage VDD from an external device. The second pad P2 may be configured to receive a ground voltage VSS from an external device. The first pad P1 may be connected to a first line L1 for transmitting the power voltage VDD. The second pad P2 may be connected to a second line L2 for transmitting the ground voltage VSS.

An internal circuit 110 may be connected between the first line L1 and the second line L2. The internal circuit 110 may include a circuit block configured to perform operations by receiving the power voltage VDD and the ground voltage VSS. For example, the internal circuit 110 may include a memory cell array block, a memory cell control circuit block, etc.

An EOS protecting circuit 200 may be connected between the first line L1 and the second line L2. The EOS protecting circuit 200 may be positioned adjacent to the first pad P1 and the second pad P2. In an embodiment, the EOS protecting circuit 200 may be positioned adjacent to the first pad P1 and the second pad P2 closer than the internal circuit 110. Thus, an over-shooting voltage inputted from the first pad P1 may not be directly applied to the internal circuit 110.

The EOS protecting circuit 200 may include an Ovonic threshold switch (OTS) unit. The OTS unit may include a phase changeable material having variable resistances in accordance with a voltage difference applied to the EOS protecting circuit 200.

Figure 2:
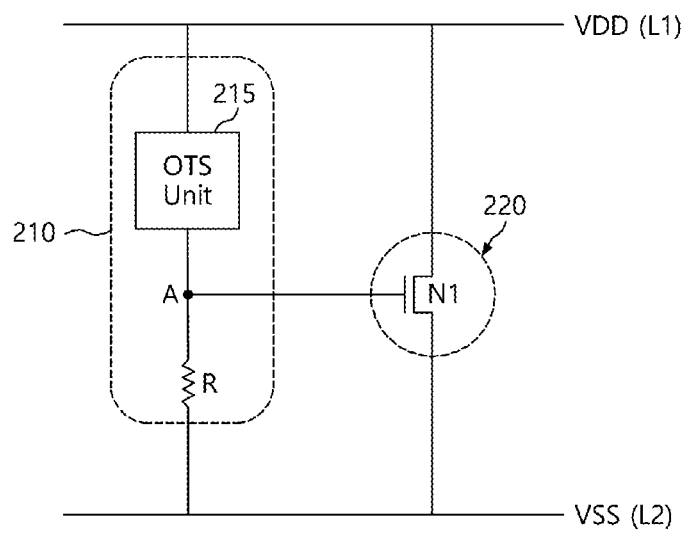
FIG. 2 is a circuit diagram illustrating a representation of an EOS protecting circuit of a semiconductor integrated circuit device in accordance with examples of embodiments.

FIG. 2 is a circuit diagram illustrating a representation of an EOS protecting circuit of a semiconductor integrated circuit device in accordance with examples of embodiments.

Referring to FIG. 2, the EOS protecting circuit 200 may include a first discharging unit 210 and a second discharging unit 220.

The first discharging unit 210 may be connected between the first line L1 and the second discharging unit 220. The first discharging unit 210 may include an OTS unit 215 and a resistance R. The second discharging unit 220 may include an NMOS transistor N1. The NMOS transistor N1 in the second discharging unit 220 may discharge the EOS from the first pad P1 to the second line L2 in response to an output voltage from the first discharging unit 210. The NMOS transistor comprises a gate connected with an output of the OTS unit 215, a drain connected to the first line L1 and a source connected to the second line L2. In an embodiment, the first discharging unit 210 may include a node A located between the OTS unit 215 and the resistance R. The node A may be coupled to the gate of the NMOS transistor N1.

Figure 3:
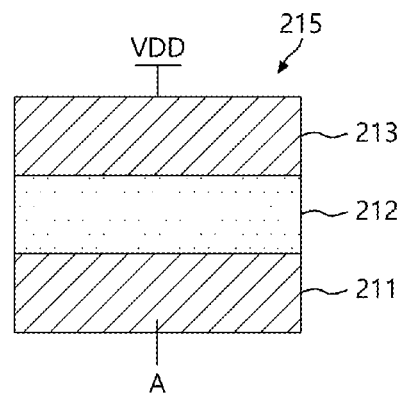
FIG. 3 is a cross-sectional view illustrating a representation of an OTS unit in accordance with examples of embodiments.

FIG. 3 is a cross-sectional view illustrating a representation of an OTS unit in accordance with examples of embodiments.

Referring to FIG. 3, the OTS unit 215 may include a lower electrode 211, a phase changeable layer 212 and an upper electrode 213. The phase changeable layer 212 may include chalcogenide. The OTS unit 215 may use characteristics of the chalcogenide for on/off (on and off) operations. When a voltage or a current, which may be substantially equal to or higher than a critical voltage (or a threshold voltage) or a critical current (or a threshold current) of the chalcogenide, may be applied to the upper electrode 213 or the lower electrode 211, the chalcogenide layer 212 may have a switching characteristic where a state having a high resistance (a amorphous state or an insulating state) may be induced to a conductive state having a low resistance. Because the OTS unit 215 may have the above-mentioned chalcogenide characteristics, the OTS unit 215 may provide a rapid switching characteristic and a reproducible switching characteristic.

The chalcogenide layer 212 may include a chalcogenide element and at least one chemical or modifying element. For example, the chalcogenide layer 212 may include Te, Se or S in group VI. The modifying element may include Ga, Al or In in group III or P, As or Sb in group V. A composition ratio of the above-mentioned elements and a thickness of the chalcogenide layer 212 may represent various resistances. The upper electrode 213 may be connected to the first line L1. The lower electrode 211 may be connected to the second discharging unit 220 and the resistance R. In an embodiment, the lower electrode 211 may be connected to the second discharging unit 220 and the resistance R through a node A.

The resistance R may be connected between the OTS unit 215 and the second line L2 to transmit a current outputted from the OTS unit 215 to the second line L2.

Figure 4:
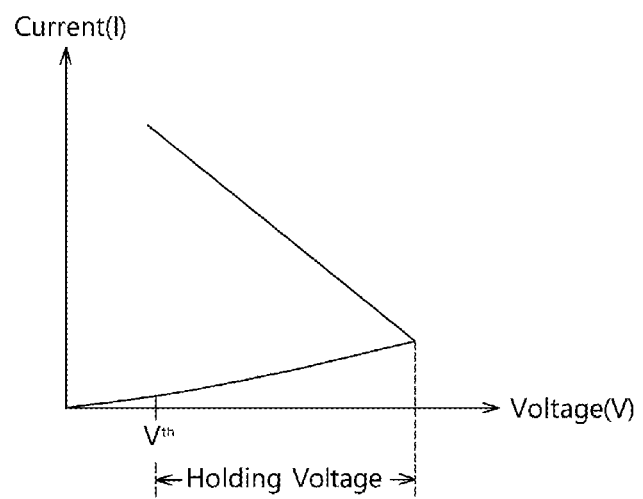
FIG. 4 is a graph illustrating current-voltage characteristics of an OTS unit in accordance with examples of embodiments.

FIG. 4 is a graph illustrating current-voltage characteristics of an OTS unit in accordance with examples of embodiments.

Referring to FIG. 4, the OTS unit 215 may have a snap back. That is, the OTS unit 215 may be maintained in an "off" state, for example, a non-conductive state in response to a voltage lower than a critical voltage Vth. The OTS unit 215 may be snapped back to an "on" state in response to a voltage higher than the critical voltage Vth. That is, the OTS unit 215 having the "on" state may transmit a great amount of the current using a voltage characteristic in which a holding voltage level may be still maintained. Thus, the EOS in the first pad P1 and the first line L1 may be effectively transmitted through the OTS unit 215.

Hereinafter, operations of a semiconductor integrated circuit device will be discussed.

When the EOS is generated, for example, in the first line L1 through which the power voltage VDD may be transmitted, a voltage difference may be generated between the upper electrode 213 and the lower electrode 211 of the OTS unit 215 in the first discharging unit 210 so that the OTS unit 215 may be turned-on. The EOS is discharged, for example, to the second line L2 through the first discharging unit 210, i.e., the OTS unit 215 and the resistance R. Because a great amount of the current may be discharged in a short time due to the current-voltage characteristic of the OTS unit 215, a voltage drop in the resistance R may rapidly be generated. A voltage level of an output node A in the first discharging unit 210 may be increased.

When the voltage of the output node A is, for example, no less than a threshold voltage of the NMOS transistor N1, the NMOS transistor N1 may be turned-on so that the EOS in the first line L1 is additionally discharged to the second line L2.

According to examples of embodiments, the OTS unit may be used as the discharging unit for discharging the EOS. The EOS may be autonomously discharged in a short time by the inherent characteristic of the OTS unit. Further, the discharging transistor between the VDD line and the VSS line may be operated to remove the EOS.

Furthermore, the OTS unit may occupy a small area compared to a diode. The OTS unit may include the chalcogenide layer between the electrodes. Therefore, the semiconductor integrated circuit device may be readily designed and manufactured.

Figure 5:
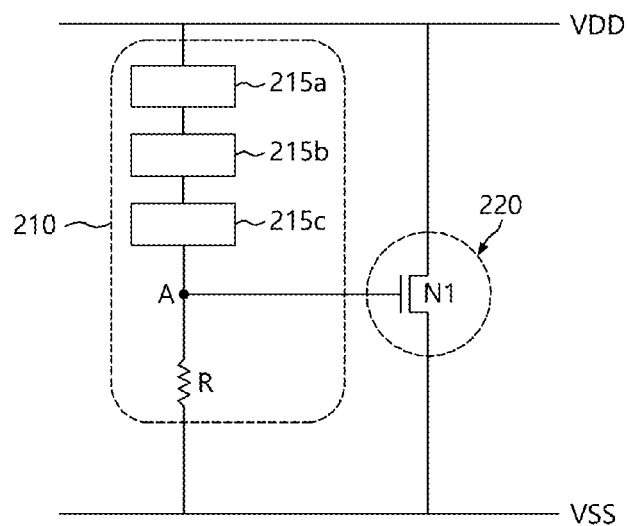
FIG. 5 is a circuit diagram illustrating a representation of an EOS protecting circuit of a semiconductor integrated circuit device in accordance with examples of embodiments.

FIG. 5 is a circuit diagram illustrating a representation of an EOS protecting circuit of a semiconductor integrated circuit device in accordance with examples of embodiments.

Referring to FIG. 5, the first discharging unit 210 may include a plurality of the OTS units 215a, 215b and 215c connected in series.

Figure 6:
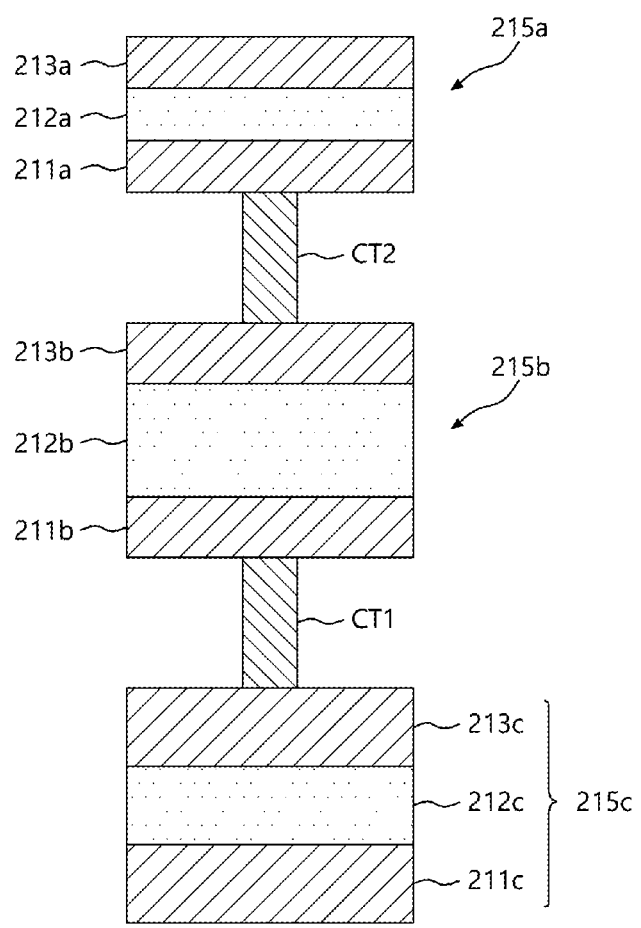
FIG. 6 is a cross-sectional view illustrating a representation of an example of the OTS units in FIG. 5.

FIG. 6 is a cross-sectional view illustrating a representation of an example of the OTS units in FIG. 5.

Referring to FIG. 6, the OTS units 215a, 215b and 215c may be sequentially stacked. The OTS units 215a, 215b and 215c may be connected with each other by contacts CT1 and CT2.

The OTS units 215a, 215b and 215c may be designed by controlling substantially the same size and thickness of the chalcogenide layer or phase changeable layer (i.e., 212a, 212b, 212c) to provide the OTS units 215a, 215b and 215c with substantially the same resistances under substantially the same conditions. Alternatively, the OTS units 215a, 215b and 215c may have different resistances under substantially the same condition.

When the OTS units 215a, 215b and 215c are stacked, removing the EOS having a high level may be effectively removed without requiring a large area. FIG. 6 also illustrates upper electrodes 213a, 213b, and 213c for the OTS units 215a, 215b, and 215c, respectively. FIG. 6 also illustrates lower electrodes 211a, 211b, and 211c for the OTS units 215a, 215b, and 215c, respectively.

The semiconductor integrated circuit device of the example embodiments may be applied to a system using a hardware and/or a software.

Figure 7:
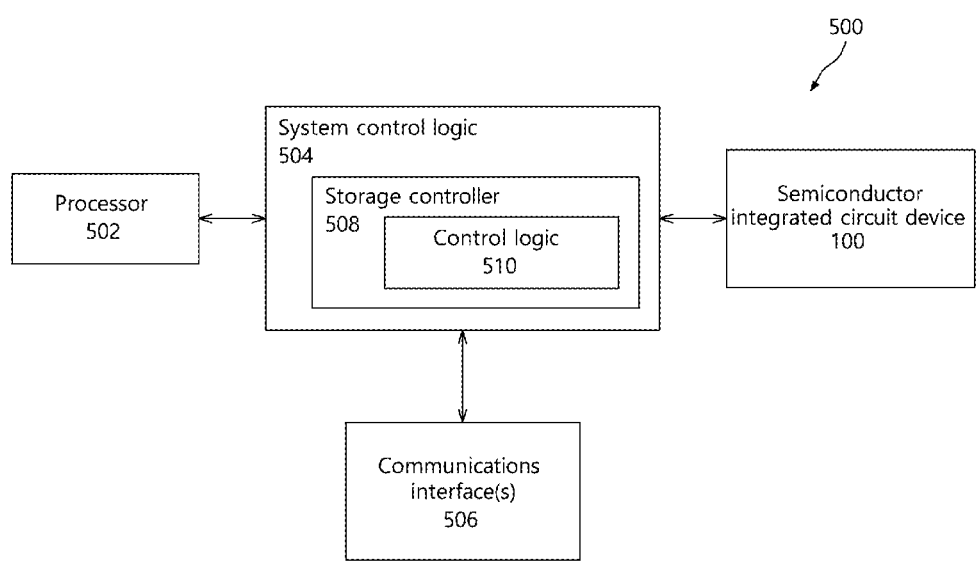
FIG. 7 is a block diagram illustrating a representation of a system in accordance with examples of embodiments.

FIG. 7 is a block diagram illustrating a representation of a system in accordance with examples of embodiments.

Referring to FIG. 7, a system 500 may include a system control logic 504, the semiconductor integrated circuit device 100 and at least one communication interface 506. The system control logic 504 may be connected with at least one of processors 502. The semiconductor integrated circuit device 100 may be connected with the system control logic 504. The communication interface 506 may be connected with the system control logic 504.

The communication interface 506 may provide an interface for the system 500 configured to be communicated with devices through at least one network. The communication interface 506 may include a hardware and/or a firmware. In examples of embodiments, the communication interface 506 may include a network adaptor, a wireless network adaptor, a telephone modem and/or a wireless modem. The communication interface 506 may use at least one antenna for a wireless communication.

At least one of the processors 502 may be packed with a logic for at least one controller of the system control logic 504. In examples of embodiments, the processor 502 may be packed with the logic for the controller of the system control logic 504 to form a system in package (SIP).

In examples of embodiments, at least one of the processors 502 may be arranged on a die in which the logic for the controller of the system control logic may be installed.

In examples of embodiments, at least one of the processors 502 may be arranged on the die in which the logic for the controller of the system control logic may be installed to form a system on chip (SOC).

In examples of embodiments, the system control logic 504 may include interface controllers configured to provide a device or a component communicated with at least one of the processors 502 and/or the system control logic 504 with interfaces.

In examples of embodiments, the system control logic 504 may include a storage controller 508 configured to provide the semiconductor integrated circuit device 100 with interfaces for controlling various access operations such as a set operation, a reset operation, a read operation, etc. The storage controller 508 may include a control logic 510 configured to control the semiconductor integrated circuit device 100. The control logic 510 may additionally generate various selection signals for controlling drivers, level shifters, global selectors, etc. When the control logic 510 may be operated by at least one of the processors 502, the control logic 510 may include commands stored in a computer readable medium for performing the above-mentioned operations of the storage controller 508.

In examples of embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
a first discharging unit connected between a first line having a first voltage level and a second line having a second voltage level different from the first voltage level to discharge an electrical over stress (EOS) generated in the first line through the second line; and
a second discharging unit connected between the first line and the second line to discharge the EOS in the first line to the second line, wherein the second discharging unit is driven in response to an output signal of the first discharging unit,
wherein the first discharging unit comprises a plurality of Ovonic threshold switch (OTS) units which are connected in series, each of the OTS units including a phase changeable layer having variable resistances in accordance with a voltage difference between the first line and the second line.

2. The semiconductor integrated circuit device of claim 1, wherein the first line is configured to transmit a power voltage, and the second line is configured to transmit a ground voltage.

3. The semiconductor integrated circuit device of claim 1, wherein the OTS unit comprises:
an upper electrode coupled to the first line;
a lower electrode coupled to the second discharging unit; and a chalcogenide layer interposed between the upper electrode and the lower electrode.

4. The semiconductor integrated circuit device of claim 1, wherein each of the OTS units has a substantially same resistance under a substantially same condition.

5. The semiconductor integrated circuit device of claim 1, wherein the OTS units have different resistances under a substantially same condition.

6. The semiconductor integrated circuit device of claim 1, wherein the second discharging unit comprises an NMOS transistor, and the NMOS transistor comprises a gate coupled with a lower electrode of one of the OTS units from the plurality of OTS units.

7. The semiconductor integrated circuit device of claim 1, wherein the first discharging unit further comprises a resistance coupled between the OTS unit and the second line.

8. The semiconductor integrated circuit device of claim 1, wherein the first discharging unit is configured to maintain a non-conductive state based on a voltage lower than a critical voltage.

9. The semiconductor integrated circuit device of claim 1, wherein the first discharging unit is configured to transmit current based on a voltage higher than a critical voltage.

10. The semiconductor integrated circuit device of claim 1, wherein the plurality of OTS units are stacked, and the stacked OTS units are electrically connected by contact portions.

* * * * *